(12) United States Patent
Kim et al.

(10) Patent No.: US 9,961,290 B2
(45) Date of Patent: May 1, 2018

(54) IMAGE SENSOR INCLUDING ROW DRIVERS AND IMAGE PROCESSING SYSTEM HAVING THE IMAGE SENSOR

(71) Applicants: Byung Jo Kim, Seoul (KR); Ji Hun Shin, Seongnam-si (KR); Won Baek Lee, Suwon-si (KR); Jin Ho Seo, Seoul (KR)

(72) Inventors: Byung Jo Kim, Seoul (KR); Ji Hun Shin, Seongnam-si (KR); Won Baek Lee, Suwon-si (KR); Jin Ho Seo, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 184 days.

(21) Appl. No.: 14/334,008

(22) Filed: Jul. 17, 2014

(65) Prior Publication Data

US 2016/0021321 A1  Jan. 21, 2016

(51) Int. Cl.
| | |
|---|---|
| *H04N 3/14* | (2006.01) |
| *H04N 5/378* | (2011.01) |
| *H04N 5/376* | (2011.01) |
| *H04N 5/341* | (2011.01) |
| *H04N 5/335* | (2011.01) |
| *H01L 27/146* | (2006.01) |

(52) U.S. Cl.
CPC ............ *H04N 5/378* (2013.01); *H04N 5/341* (2013.01); *H04N 5/376* (2013.01); *H01L 27/14643* (2013.01)

(58) Field of Classification Search
CPC ...... H04N 5/345; H04N 5/3456; H04N 5/374; H04N 5/3742; H04N 5/376; H04N 5/23212; H04N 5/3696; H04N 3/1506; H04N 5/341; H04N 5/378; H01L 27/146; H01L 27/14603; H01L 27/14643
USPC .......................................... 348/294, 308–310
See application file for complete search history.

(56) References Cited

U.S. PATENT DOCUMENTS

| | | | |
|---|---|---|---|
| 6,603,513 B1 | 8/2003 | Berezin | |
| 7,515,183 B2 | 4/2009 | Yang et al. | |
| 7,728,891 B2 | 6/2010 | Hiyama et al. | |
| 7,746,399 B2* | 6/2010 | Itoh | H04N 5/23241 348/302 |
| 7,750,278 B2* | 7/2010 | Oike | H04N 5/35554 250/208.1 |
| 7,800,672 B1 | 9/2010 | Gomi et al. | |
| 7,880,786 B2 | 2/2011 | Muramatsu | |
| 8,102,463 B2* | 1/2012 | Komaba | G03B 13/18 348/302 |
| 8,120,685 B2 | 2/2012 | Lee | |
| 8,497,921 B2* | 7/2013 | Takenaka | H04N 5/3452 250/208.1 |
| 8,717,471 B2* | 5/2014 | Sato | H04N 5/3742 348/294 |

(Continued)

*Primary Examiner* — Ngoc-Yen Vu
(74) *Attorney, Agent, or Firm* — Volentine & Whitt, PLLC

(57) ABSTRACT

An image sensor includes multiple pixel groups arranged in a row included in a pixel array, the row including multiple pixels respectively allocated to the multiple pixel groups. The image sensor further includes multiple row drivers configured to respectively control operations of the pixels respectively allocated to the pixel groups in the row, and multiple readout circuits configured to respectively read out pixel signals output by the pixels respectively allocated to the pixel groups in the row.

17 Claims, 15 Drawing Sheets

(56) References Cited

U.S. PATENT DOCUMENTS

| | | | |
|---|---|---|---|
| 8,749,695 B2* | 6/2014 | Kita | H04N 5/23212 |
| | | | 348/294 |
| 2004/0145668 A1 | 7/2004 | Iwasawa et al. | |
| 2004/0201762 A1* | 10/2004 | Gomi | H04N 3/1512 |
| | | | 348/308 |
| 2009/0273696 A1* | 11/2009 | Krymski | H04N 5/3742 |
| | | | 348/302 |
| 2010/0085456 A1* | 4/2010 | Ito | H04N 3/1593 |
| | | | 348/302 |
| 2011/0080492 A1 | 4/2011 | Matsuda et al. | |
| 2012/0112039 A1 | 5/2012 | Sugano et al. | |
| 2012/0175498 A1 | 7/2012 | Krymski | |
| 2013/0293736 A1* | 11/2013 | Kuwazoe | H04N 5/3696 |
| | | | 348/222.1 |

* cited by examiner

IMAGE SENSOR INCLUDING ROW DRIVERS AND IMAGE PROCESSING SYSTEM HAVING THE IMAGE SENSOR

CROSS-REFERENCE TO RELATED APPLICATIONS

A claim for priority under 35 U.S.C. § 119 is made to Korean Patent Application No. 10-2013-0096453 filed on Aug. 14, 2013, in the Korean Intellectual Property Office, the entire contents of which are hereby incorporated by reference.

BACKGROUND

Exemplary embodiments relate to an image sensor, and more particularly, to an image sensor capable of independently controlling multiple pixels respectively allocated in row drivers, a method of operating the image sensor, a method of manufacturing the image sensor, and an image processing system including the image sensor.

Generally, image sensors transform optical images into electric signals. Such image sensors are classified as charged coupled device (CCD) image sensors or complementary metal-oxide-semiconductor (CMOS) image sensors.

CMOS image sensor chips are a sort of active pixel sensors manufactured using a CMOS semiconductor process. Such CMOS image sensor chips include a pixel array including multiple pixels. Each of the pixels includes a photoelectric conversion device that transforms an optical signal into an electric signal, and additional circuitry that transforms the electric signal into digital data.

SUMMARY

According to an aspect of the inventive concept, there is provided an image sensor that includes multiple pixel groups arranged in a row included in a pixel array, the row including multiple pixels respectively allocated to the multiple pixel groups. The image sensor further includes multiple row drivers configured to respectively control operations of the pixels respectively allocated to the pixel groups in the row, and multiple readout circuits configured to respectively read out pixel signals output by the pixels respectively allocated to the pixel groups in the row.

The type of pixels included in a first pixel group from among the multiple pixel groups may be the same as or different from the type of pixels in a second pixel group from among the multiple pixel groups.

The image sensor may further include multiple control circuits configured to respectively control operations of the multiple row drivers, where the multiple row drivers share pixel control signals output by one of the multiple control circuits.

Respective operations of the readout circuits may be controlled in response to readout control signals output by the one of the multiple control circuits. One of the pixel control signals may be associated with the control of exposure time. Also, the multiple row drivers may be activated at different frames.

The image sensor may further include multiple control circuits configured to respectively generate corresponding pixel control signals in order to independently control operations of the multiple row drivers, respectively. Respective operations of the multiple readout circuits may be controlled in response to respective readout control signals output by the multiple control circuits.

The image sensor may further include multiple control circuits configured to respectively control operations of the multiple row drivers. A timing of pixel control signals output by a first control circuit of the multiple control circuits is the same as a timing of pixel control signals output by a second control circuit of the multiple control circuits. Or, a timing of pixel control signals output by a first control circuit of the multiple control circuits is different from a timing of pixel control signals output by a second control circuit of the multiple control circuits.

According to another aspect of the inventive concept, there is provided a processing system including an image sensor and a processor configured to control operations of the image sensor. The image sensor includes a first pixel group arranged in at least a first column and a first row included in a pixel array; a second pixel group arranged at least a second column and the first row included in the pixel array; a first row driver configured to control operation of first pixels included in the first pixel group; a second row driver configured to control operation of second pixels included in the second pixel group; a first readout circuit corresponding to the first column, configured to read out first output signals of the first pixels; and a second readout circuit corresponding to the second column, configured to read out second output signals of the second pixels. A type of the first pixels may be different from a type of the second pixels.

The image processing system may further include a first control circuit configured to generate a first address and pixel control signals, and a second control circuit configured to generate a second address. The first row driver may control operations of the first pixels based on the first address and the pixel control signals, and the second row driver may control operations of the second pixels based on the second address and the pixel control signals.

The first readout circuit and the second readout circuit may be controlled by one of the first control circuit and the second control circuit. A timing of the first address may be the same as a timing of the second address.

The image processing system may further include a first control circuit configured to generate a first address and first pixel control signals, and a second control circuit configured to generate a second address and second pixel control signals. The first row driver may control operations of the first pixels based on the first address and the first pixel control signals, and the second row driver may control operations of the second pixels based on the second address and the second pixel control signals.

The first readout circuit and the second readout circuit may b e controlled by the first control circuit and the second control circuit, respectively. A timing of the first pixel control signals may be different from a timing of the second pixel control signals.

According to another aspect of the inventive concept, there is provided a method of manufacturing an image sensor. The method includes forming A pixels in a row of a pixel array, where A is a natural number; grouping the A pixels formed in the row into B pixel groups in a column direction, where B is a natural number and 1<B<A; forming B row driver circuits corresponding to the B pixel groups; and connecting pixels allocated to each of the B pixel groups with each of the B row driver circuits, via respective first signal lines.

The method may further include forming B control circuits corresponding to the B pixel groups; and connecting one of the B row driver circuits with the B row drivers via respective second signal lines in order to supply pixel control signals output by the one of the B control circuits to each of the B row driver circuits. Alternatively, the method may further include forming B control circuits corresponding to the B pixel groups; and connecting the B control circuits with the B row drivers, respectively, via respective second signal lines in order to supply pixel control signals output by the B control circuits to the respective B row driver circuits.

According to another aspect of the inventive concept, there is provided a method of operating an image sensor. The method includes selecting first readout pixels allocated to a first row driver from among multiple row drivers, from multiple pixels arranged in a row of a pixel array; and processing first pixel signals output by the first readout pixels, using a first readout circuit from among multiple readout circuits.

The method may further include selecting second readout pixels allocated to a second row driver from among the multiple mw drivers, from multiple pixels; and processing second pixel signals output by the second readout pixels, using a second readout circuit from among the multiple readout circuits. The processing of the first pixel signals and the processing of the second pixel signals may be performed simultaneously or at different timings.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
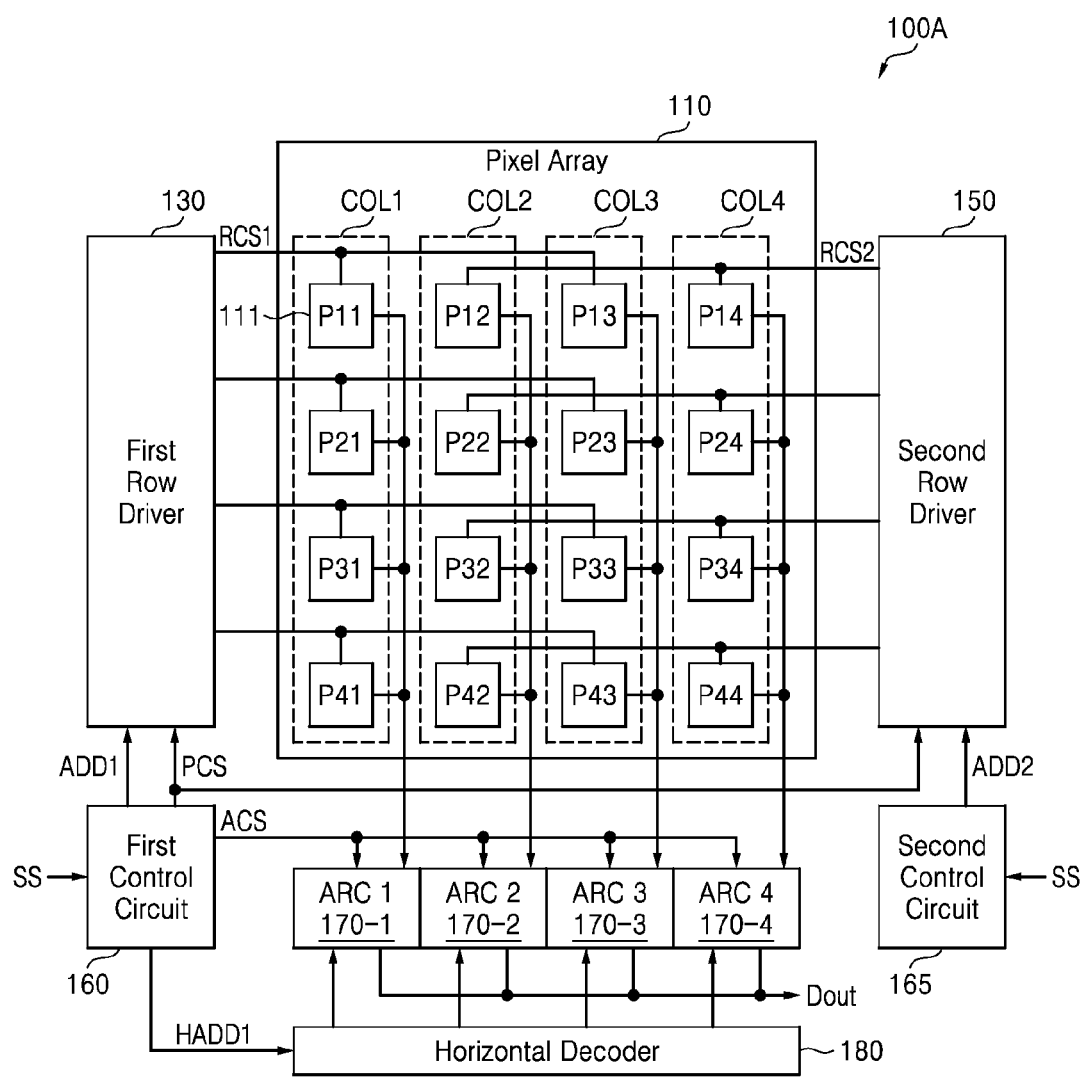
FIG. 1 is a schematic block diagram of an image sensor including multiple row drivers, according to an embodiment of the inventive concept.

Embodiments will be described in detail with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to one of ordinary skill in the art. Accordingly, known processes, elements, and techniques are not described with respect to some of the embodiments. Unless otherwise noted, like reference numerals denote like elements throughout the attached drawings and written description. In the drawings, sizes and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/". Also, the term "exemplary" refers to an illustration or example.

It will be understood that, although the terms first, second, etc., may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein FIG. 1 is a schematic block diagram of an image sensor 100A including a plurality of row drivers, according to an embodiment of the inventive concept. Referring to FIG. 1, the image sensor 100A, for example, a CMOS image sensor, includes a pixel array 110, a first row driver 130, a second row driver 150, a first control circuit 160, a second control circuit 165, multiple readout circuits (ARCs) 170-1 through 170-4, and a horizontal decoder 180.

The image sensor 100A transforms an optical image into an electric signal. The image sensor 100A may be implemented using an integrated circuit (IC), and may be used in various devices, such as digital cameras, camera modules, imaging devices, smart phones, tablet PCs, camcorders, personal digital assistants (PDAs), or mobile internet devices (MIDs), for example.

The pixel array 110 includes multiple pixels, which may be referred to as active pixel sensors. The multiple pixels may be arranged in a matrix form. For convenience of explanation, FIG. 1 illustrates the pixel array 110 as including a 4×4 array of pixels P11-P14, P21-P24, P31-P34, and P41-P44. However, pixel arrays other than 4×4 arrangement of pixels may included in the pixel array 110 without departing from the scope of the present teachings.

Figure 7:
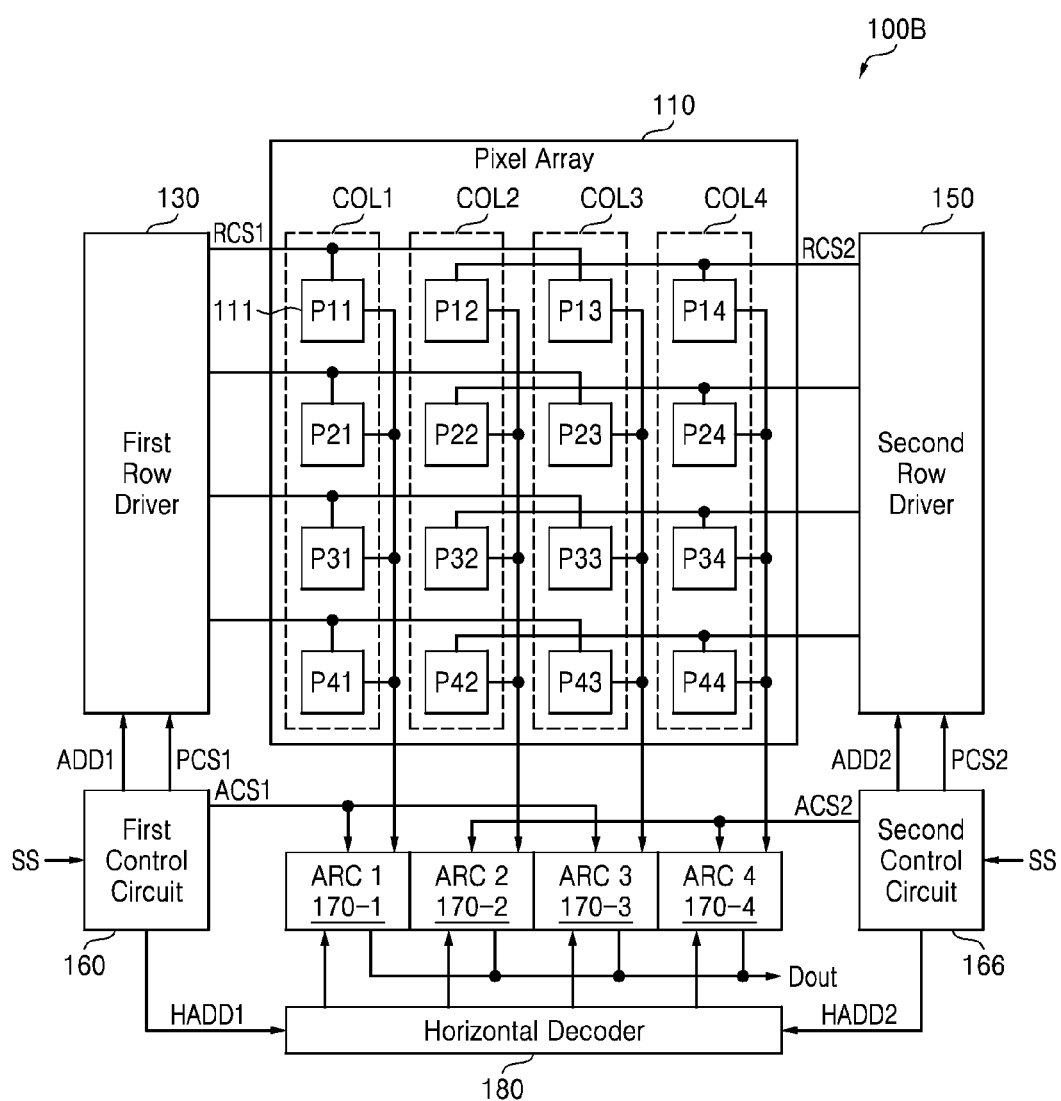
FIG. 7 is a schematic block diagram of an image sensor including multiple row drivers, according to another embodiment of the inventive concept.
Figure 9:
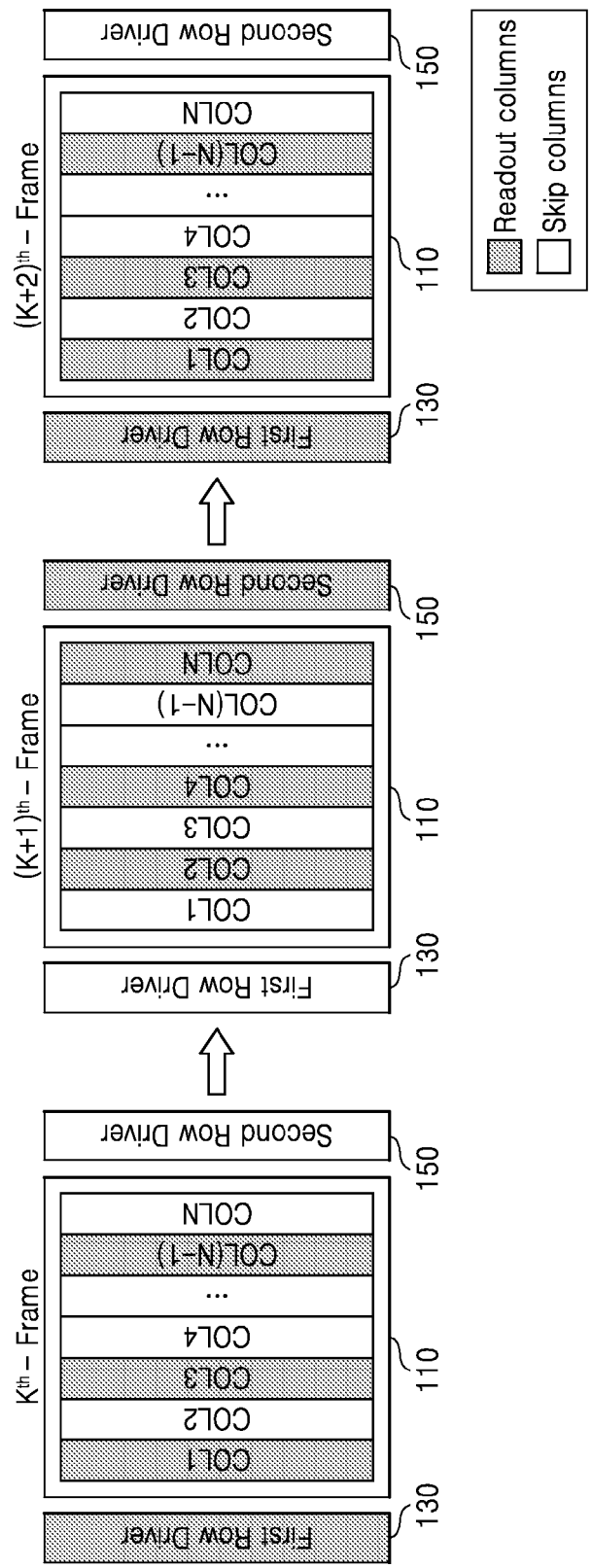
FIG. 9 is a conceptual diagram for describing operation of the image sensor illustrated in FIG. 1 or 7, according to embodiments of the inventive concept.
Figure 10:
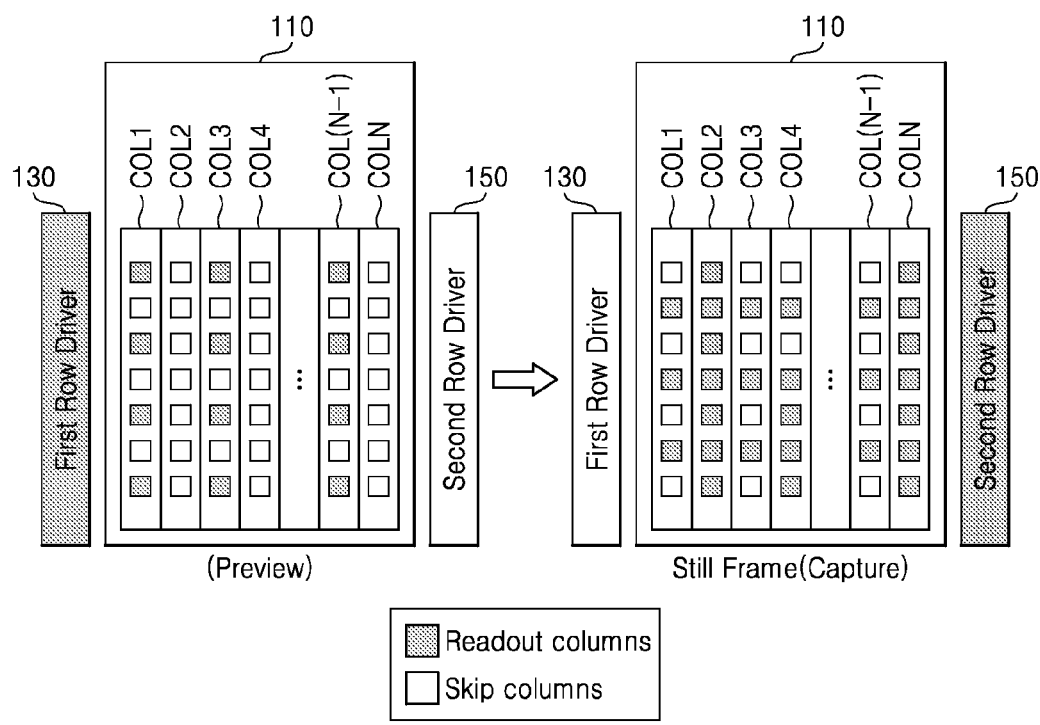
FIG. 10 is a conceptual diagram for describing operation of the image sensor illustrated in FIG. 1 or 7, according to embodiments of the inventive concept.
Figure 11:
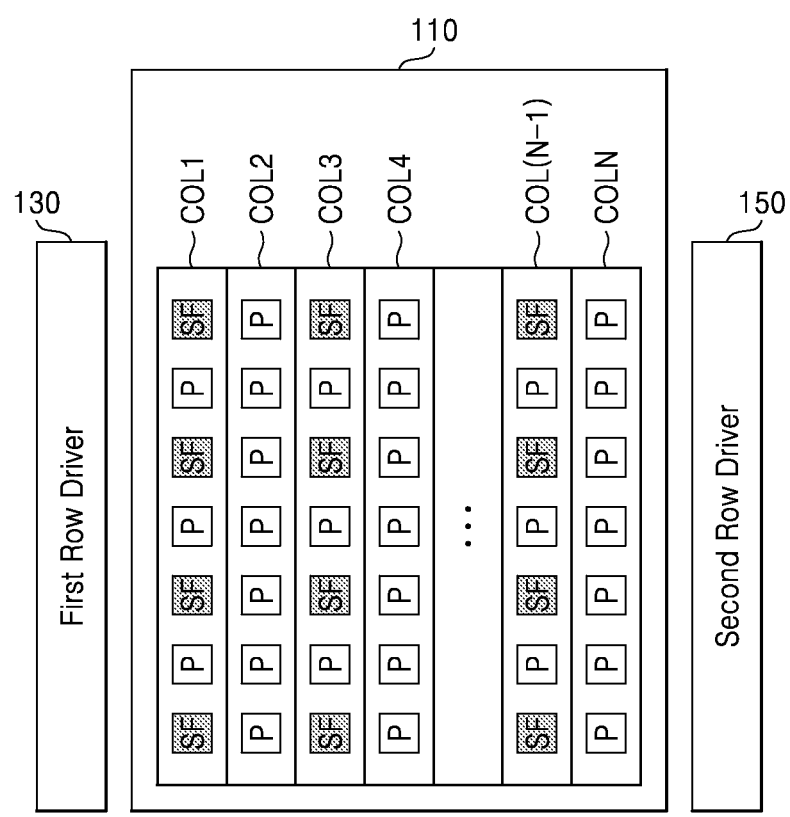
FIG. 11 is a conceptual diagram for describing operation of the image sensor illustrated in FIG. 1 or 7, according to embodiments of the inventive concept.

Pixel groups generally may be defined according to a column direction, although one pixel group may include pixels in multiple columns. For example, as illustrated in FIGS. 1, 7, and 9, all of the pixels included in a column may be included in a pixel group. However, as illustrated in FIGS. 10 and 11, for example, some of the pixels included in a column may be included in one pixel group, and the rest of the pixels included in the same column may be included in another pixel group.

Referring to FIG. 1, for example, a first pixel group may include pixels in odd-numbered columns COL1 and COL3 and a second pixel group may include pixels in even-numbered columns COL2 and COL0. That is, the first pixel group may include pixels P11 and P13 implemented in a first row, pixels P21 and P23 implemented in a second row, pixels P31 and P33 implemented in a third row, and pixels P41 and P43 implemented in a fourth row. The second pixel group may include pixels P12 and P14 implemented in the first row, pixels P22 and P24 implemented in the second row, pixels P32 and P34 implemented in the third row, and pixels P42 and P44 implemented in the fourth row.

In the first row, the first pixel group includes the pixels P11 and P13, and the second pixel group includes the pixels P12 and P14. In the fourth row, the first pixel group includes the pixels P41 and P43, and the second pixel group includes the pixels P42 and P44. In other words, the pixel array 110 includes the first pixel group and the second pixel group, each including pixels arranged in each row. Of course, other configurations pixels in pixel groups may be implemented without departing from the scope of the present teachings.

The types of pixels included in the first pixel group may be the same as or different from the types of pixels included in the second pixel group. For example, the type of pixels included in the first pixel group may be for color detection (hereinafter, referred to as color pixels), and the type of pixels included in the second pixel group may be for performing a special purpose (hereinafter, referred to as special purpose pixels).

The color pixels may include a red pixel, a green pixel, and a blue pixel. According to an embodiment, the color pixels may further include a white pixel.

According to an embodiment, the special purpose pixels may be pixels for focus detection. According to another embodiment, the special purpose pixels may include phase difference detection pixels capable of performing autofocusing or pixels for contrast detection. According to another embodiment, the special purpose pixels may be pixels for detecting a depth (or distance), pixels for detecting motion, or dynamic vision sensors.

The first row driver 130 controls operations of pixels in the first pixel group. That is, the first row driver 130 controls operations of the pixels P11, P13, P21, P23, P31, P33, P41, and P43 of the first pixel group included in odd-numbered columns COL1 and COL3. In this case, the first row driver 130 may perform functions of a vertical decoder and a row driver for the first pixel group.

The second row driver 150 controls operations of pixels in the second pixel group. That is, the second row driver 150 controls operations of the pixels P12, P14, P22, P24, P32, P34, P42 and P44 of the second pixel group included in even-numbered columns COL2 and COL4. In this case, the second driver 150 may perform functions of a vertical decoder and a row driver for the second pixel group.

In FIG. 1, the first row driver 130 is disposed on a first side of the pixel array 110, and the second row driver 150 is disposed on a second side of the first row driver 130 that is opposite to the first side. However, according to other embodiments, the positions of the first row driver 130 and the second row drivers 150 may vary according to designs.

The first control circuit 160 controls operations of the first row driver 130, and the second control circuit 165 controls operations of the second row driver 150. For example, the first control circuit 160 performs the function of a timing generator, and generates a first address ADD1 and pixel control signals PCSs based on a starting signal SS. The first address ADD1 may be an address for selecting a corresponding row from among a plurality of rows of the pixel array 110. For example, one of the pixel control signals PCSs may be a signal associated with controlling exposure time.

Thus, the first row driver 130 generates row control signals RCS1 for controlling the pixels P11 and P13 of the first pixel group included in the first row, based on the first address ADD1 and the pixel control signals PCSs. The first row driver 130 may also generate corresponding row control signals for controlling the pixels P21, P23, P31, P33, P41, and P43 of the first pixel group included in the second, third, and fourth rows, respectively, based on the first address ADD1 and the pixel control signals PCSs.

The second control circuit 165 similarly performs the function of a timing generator, and generates a second address ADD2 based on the starting signal SS. The second address ADD2 may be an address for selecting a corresponding row from among the rows of the pixel array 110. Thus, the second row driver 150 generates row control signals RCS2 for controlling the pixels P12 and P14 of the second pixel group included in the first row, based on the pixel control signals PCSs output by the first control circuit 160 and the second address ADD2. The second row driver 150 may also generate corresponding row control signals for controlling the pixels P22, P24, P32, P34, P42, and P44 of the second pixel group included in the second, third, and fourth rows, respectively, based on the second address ADD1 and the pixel control signals PCSs.

The row control signals RCS1 or RCS2 are described below with reference to FIGS. 3 through 6. For example, the first and second control circuits 160 and 165 may operate based on the starting signal SS, in order to adjust timing associated with generation and transmission of the first address ADD1 and timing associated with generation and transmission of the second address ADD2.

In addition, the second row driver 150 may generate row control signals for controlling the pixels P22, P24, P32, P34, P42 and P44 of the second pixel group included in the second, third, and fourth rows, based on the second address ADD2 and the pixel control signals PCSs. That is, the first and second row drivers 130 and 150 may share the pixel control signals PCSs generated by the first control circuit 160.

In the depicted configuration, the odd-numbered ARCs 170-1 and 170-3 from among the ARCs 170-1 through 170-4 read out output signals of the pixels included in the first pixel group. The even-numbered ARCs 170-2 and 170-4 from among the ARCs 170-1 through 170-4 read out output signals of the pixels included in the second pixel group.

Each of the ARCs 170-1 through 170-4 may perform analog-to-digital conversion (ADC). Alternatively, each of the ARCs 170-1 through 170-4 may perform correlated double sampling (CDS) and ADC. The ARCs 170-1 through 170-4 may perform analog readout or ADC based on readout control signals ACSs output by the first control circuit 160, and may output data Dout corresponding to results of the analog readout or the ADC according to output control signals output by the horizontal decoder 180. The output control signals are signals for selecting column lines of the pixel array 110. The horizontal decoder 180 generates the output control signals based on a column address HADD1 output by the first control circuit 160. The generated output control signals are output by the horizontal decoder 180 to the ARCs 170-1 through 170-4.

For convenience of explanation, FIG. 1 illustrates and describes two pixel groups, namely, the first and second pixel groups, and two row drivers, namely, the first and second row drivers 130 and 150. However, when A pixels (where A is a natural number) are arranged in the rows of the pixel array 110 and the A pixels are grouped into B pixel groups (where 1<B<A, and B is a natural number) according to a column direction, B row drivers may be arranged in the image sensor 100A in order to independently control respective operations of the B pixel groups.

According to embodiments of the inventive concept, operations of all of the pixels included in each row are not controlled using a single row driver at one time. Rather, operations of the pixels of pixel groups included in each row may be independently controlled in units of pixel groups using row drivers respectively allocated to the pixel groups.

Figure 2:
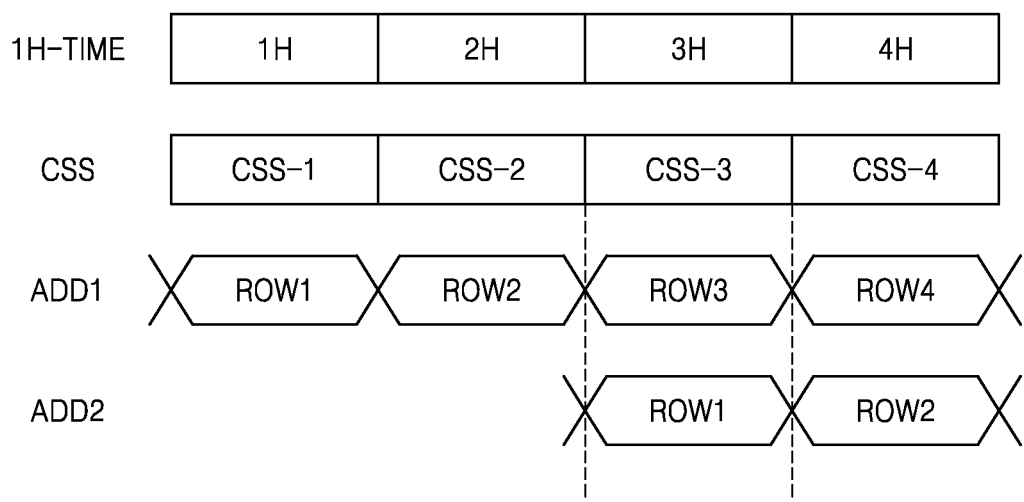
FIG. 2 is a timing diagram for describing operation of the image sensor of FIG. 1, according to an embodiment of the inventive concept.

FIG. 2 is a timing diagram for describing an illustrative operation of the image sensor 100A of FIG. 1. Referring to FIGS. 1 and 2, 1H-TIME denotes line times, and control signal set CSS denotes sets including the pixel control signals PCSs and the readout control signals ACSs.

During first, second, third, and fourth line times 1H, 2H, 3H and 4H, control signal sets CSS-1, CSS-2, CSS-3, and CSS-4 are generated, respectively. Generation (or starting) timings of first addresses ROW1, ROW2, ROW3, and ROW4 for respectively controlling pixels of the first pixel group included in the first, second, third, and fourth rows may be the same as the timings of the control signal sets CSS-1, CSS-2, CSS-3, and CSS-4, respectively. In addition, generation (or starting) timings of second addresses ROW1 and ROW2 for controlling the pixels of the second pixel group included in each row may be the same as the timings of the control signals sets CSS-3 and CSS-4.

As illustrated in FIGS. 1 and 2, during the first line time 1H, pixel signals output by the pixels P11 and P13 of the first pixel group included in the first row are read out by the ARCs 170-1 and 170-3 in response to the control signal set CSS-1 and the first address ADD1=ROW1. During the second line time 2H, pixel signals output by the pixels P21 and P23 of the first pixel group included in the second row are read out by the ARCs 170-1 and 170-3 in response to the control signal set CSS-2 and the first address ADD1=ROW2.

During the third line time 3H, pixel signals output by the pixels P31 and P33 of the first pixel group included in the third row are read out by the ARCs 170-1 and 170-3 in response to the control signal set CSS-3 and the first address ADD1=ROW3. At the same time, pixel signals output by the pixels P12 and P14 of the second pixel group included in the first row are read out by the ARCs 170-2 and 170-4 in response to the control signal set CSS-3 and the second address ADD2=ROW1.

During the fourth line time 4H, pixel signals output by the pixels P41 and P43 included in the first pixel group of the fourth row may be read out by the ARCs 170-1 and 170-3 in response to the control signal set CSS-4 and the first address ADD1=ROW4. At the same time, pixel signals output by the pixels P22 and P24 of the second pixel group included in the second row may be read out by the ARCs 170-2 and 170-4 in response to the control signal set CSS-4 and the second address ADD2=ROW2.

Figure 3:
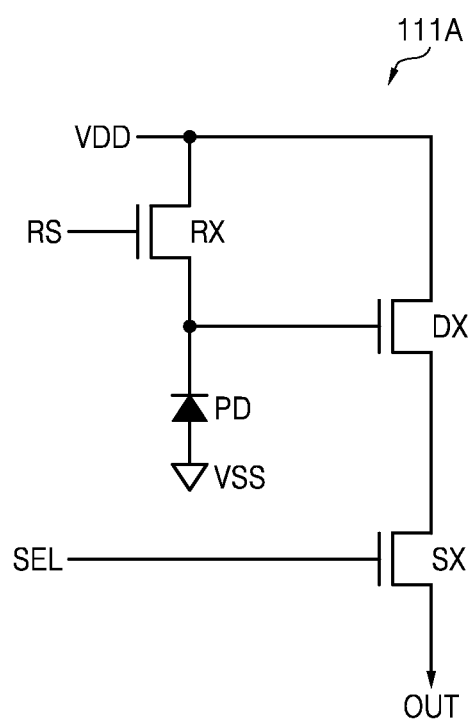
FIGS. 3 through 6 are circuit diagrams illustrating examples of pixels included in the image sensor of FIG. 1, according to embodiments of the inventive concept.

FIGS. 3 through 6 are circuit diagrams of pixels 111A, 111B, 111C and 111D, respectively, which are illustrative embodiments of pixel 111 included in the image sensor 100A of FIG. 1. Referring to FIG. 3, the pixel 111A has a 3-TR structure. The pixel 111A includes one photodiode PD and three transistors, namely, a reset transistor RX, an amplification transistor DX, and a selection transistor SX. The row control signals RCS1 of FIG. 1 include a reset signal RS controlling operation of the reset transistor RX, and a selection signal SEL controlling operation of the selection transistor SX.

Figure 4:
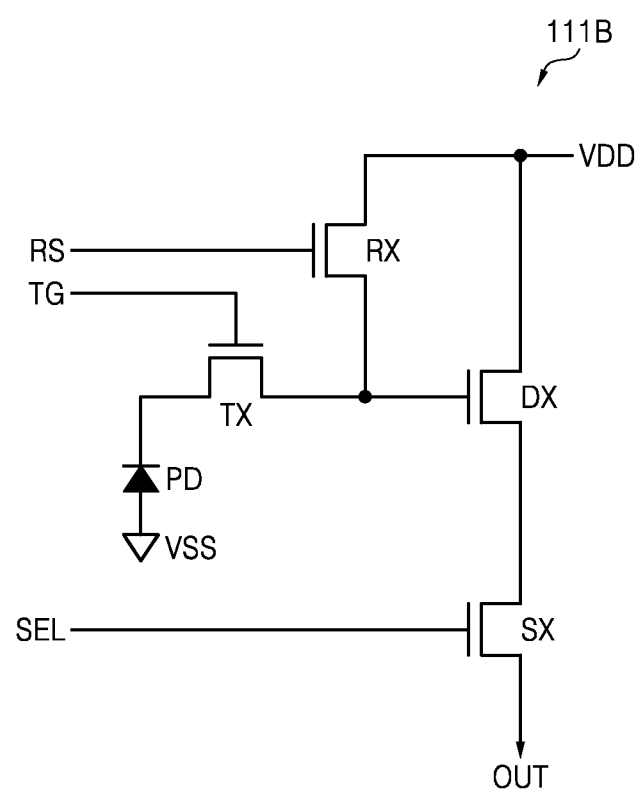

Referring to FIG. 4, the pixel 111B has a 4-TR structure. The pixel 111B includes one photodiode PD and four transistors, namely, a reset transistor RX, an amplification transistor DX, a selection transistor SX, and a transmission transistor TX. The row control signals RCS1 of FIG. 1 include a reset signal RS for controlling operation of the reset transistor RX, a selection signal SEL for controlling operation of the selection transistor SX, and a transmission control signal TG for controlling operation of the transmission transistor TX.

Figure 5:
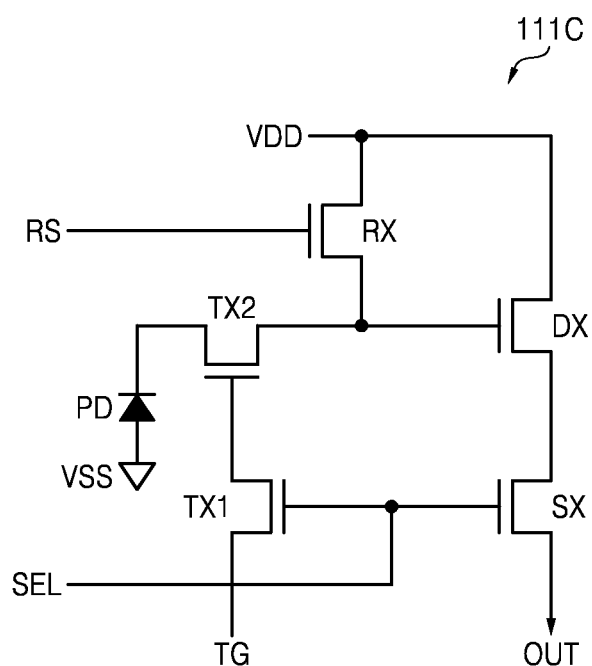

Referring to FIG. 5, the pixel 111C has a 5-TR structure. The pixel 111C includes one photodiode PD and five transistors, namely, a reset transistor RX, an amplification transistor DX, a selection transistor SX, a first transmission transistor TX1, and a second transmission transistor TX2. The row control signals RCS1 of FIG. 1 include a reset signal RS controlling operation of the reset transistor RX, a selection signal SEL controlling operation of each of the selection transistor SX and the first transmission transistor TX1, and a transmission control signal TG supplied to the first transmission transistor TX1.

Figure 6:
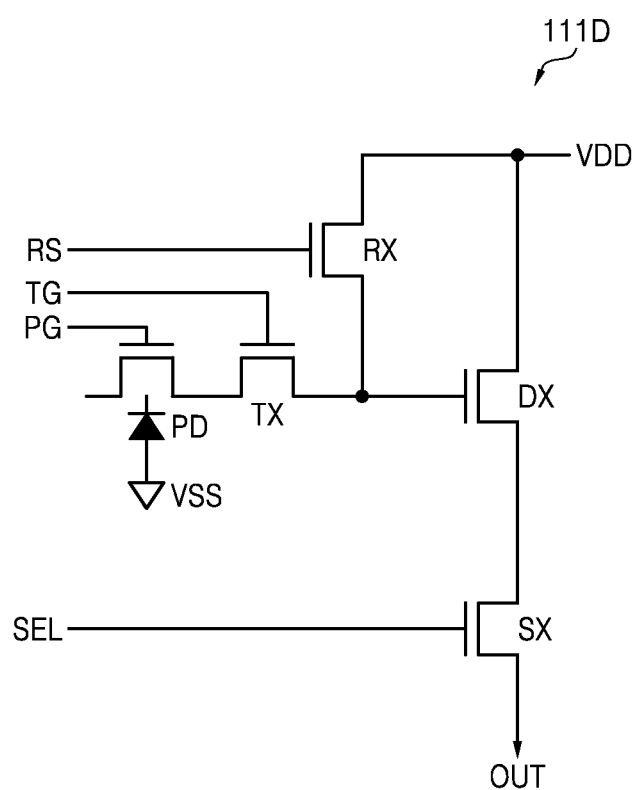

Referring to FIG. 6, the pixel 111D has a photogate structure. The pixel 111D includes one photogate PD and four transistors, namely, a reset transistor RX, an amplification transistor DX, a selection transistor SX, and a transmission transistor TX. The row control signals RCS1 of FIG. 1 include a reset signal RS for controlling operation of the reset transistor RX, a selection signal SEL for controlling operation of the selection transistor SX, a transmission control signal TG for controlling operation of the transmission transistor TX, and a photogate control signal PG for controlling operation of the photogate PD.

As illustrated in FIGS. 3 through 6, VDD denotes an operational voltage, VSS denotes ground, and OUT denotes an output for providing an output signal of each of the pixels 111A, 111B, 111C, and 111D (collectively referred to as pixel 111). Signals included in the row control signals RCS1 may vary according to the function of the pixel 111 and how the pixel 111 is implemented.

However, each of the first row driver 130 and the second driver 150 may generate the row control signals RCS1 or RCS2 capable of respectively controlling operations of pixels included in the first pixel group or pixels included in the second pixel group based on the pixel control signals PCS and the address ADD1 or ADD2.

FIG. 7 is a schematic block diagram of an image sensor 100B including a plurality of row drivers, according to another embodiment of the inventive concept. Referring to FIG. 7, the image sensor 100B, for example, a CMOS image sensor, includes a pixel array 110, a first row driver 130, a second row driver 150, a first control circuit 160, a second control circuit 166, multiple ARCs 170-1 through 170-4, and a horizontal decoder 180.

Except for the first control circuit 160, the second control circuit 166, and the ARCs 170-1 through 170-4, the structure and operations of the CMOS image sensor 100B of FIG. 7 are substantially the same as those of the CMOS image sensor 100A of FIG. 1, discussed above.

The first control circuit 160 performs the function of a timing generator, and generates a first address ADD1 and first pixel control signals PCS1 based on a starting signal SS. Thus, for example, the first row driver 130 generates row control signals RCS1 for controlling pixels P11 and P13 of a first pixel group that are included in a first row, based on the first address ADD1 and the first pixel control signals PCS1. The first row driver 130 may also generate row control signals for controlling pixels P21, P23, P31, P33, P41 and P43 of the first pixel group that are respectively included in second, third, and fourth rows, based on the first address ADD1 and the first pixel control signals PCS1.

The second control circuit 166 performs the function of a timing generator, and generates a second address ADD2 and second pixel control signals PCS2 based on the starting signal SS. For example, one of the pixel control signals PCS1 and/or PCS2 may be signals associated with the control of exposure time. Thus, for example, the second row driver 150 generates row control signals RCS2 for controlling pixels P12 and P14 of a second pixel group that are included in the first row, based on the second address ADD2 and the second pixel control signals PCS2. The second row driver 150 may also generate row control signals for controlling pixels P22, P24, P32, P34, P42 and P44 of the second pixel group that are respectively included in second, third, and fourth rows, based on the second address ADD2 and the second pixel control signals PCS2.

The odd-numbered readout circuits 170-1 and 170-3 from among the ARCs 170-1 through 170-4 may read out output signals of the pixels included in the first pixel group. The even-numbered readout circuits 170-2 and 170-4 from among the ARCs 170-1 through 170-4 may read out output signals of the pixels included in the second pixel group.

Each of the ARCs 170-1 through 170-4 may perform ADC. Alternatively, each of the ARCs 170-1 through 170-4 may perform CDS and ADC. The odd-numbered readout circuits 170-1 and 170-3 may perform analog readout or ADC based on a first readout control signals ACS1 output by the first control circuit 160, and may output data Dout corresponding to a result of the analog readout or the ADC according to first output control signals output by the horizontal decoder 180. The horizontal decoder 180 may generate the first output control signals based on a first column address HADD1 output by the first control circuit 160, and may output the generated first output control signals to the odd-numbered readout circuits 170-1 and 170-3.

The even-numbered readout circuits 170-2 and 170-4 may perform analog readout or ADC based on a second readout control signals ACS2 output by the second control circuit 166, and may output data Dout corresponding to a result of the analog readout or the ADC according to second output control signals output by the horizontal decoder 180. The horizontal decoder 180 may generate the second output control signals based on a second column address HADD2 output by the second control circuit 166, and may output the generated second output control signals to the even-numbered readout circuits 170-2 and 170-4. The first and second output control signals may be signals for selecting column lines of the pixel array 110.

Figure 8:
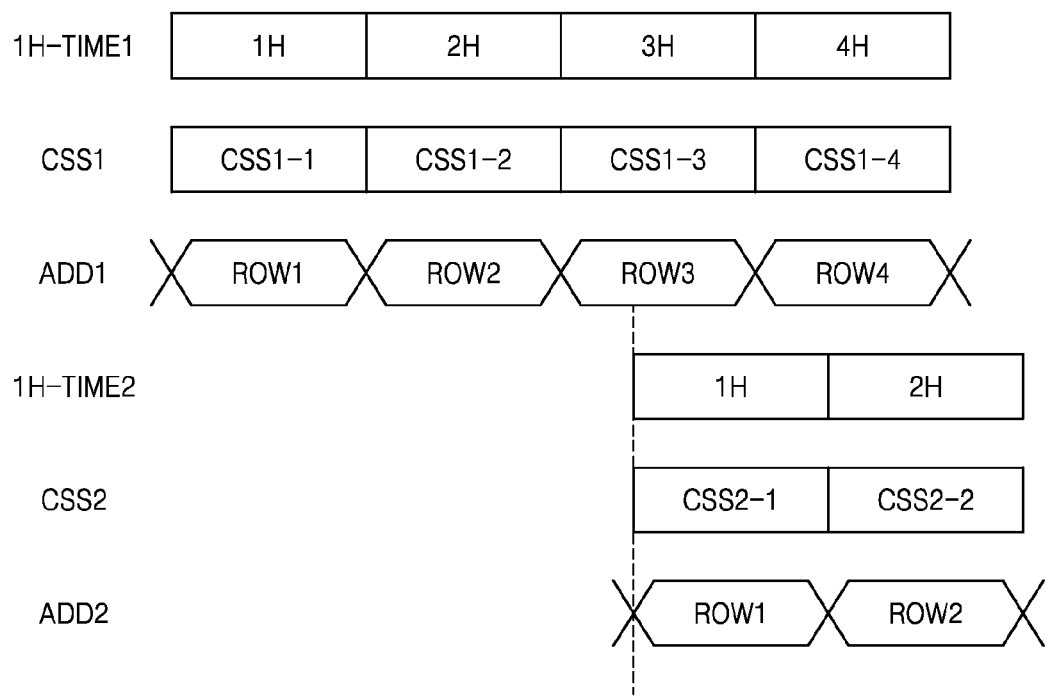
FIG. 8 is a tuning diagram for describing operation of the image sensor of FIG. 7, according to an embodiment of the inventive concept.

FIG. 8 is a timing diagram for describing operations of the image sensor 100B of FIG. 7. Referring to FIGS. 7 and 8, each of 1H-TIME1 and 1H-TIME2 denotes a line time, and the line times 1H-TIME1 and 1H-TIME2 are the same.

A first control signal set CSS1 includes the first pixel control signals PCS1 and the first readout control signals ACS1, and a second control signal set CSS2 includes the second pixel control signals PCS2 and the second readout control signals ACS2.

During first, second, third, and fourth line times 1H, 2H, 3H, and 4H of the line time 1H-TIME1, first control signal sets CSS1-1, CSS1-2, CSS1-3, and CSS1-4 are generated, respectively. Generation (or starting) timings of first addresses ROW1, ROW2, ROW3, and ROW4 for respectively controlling the first pixel group included in the first, second, third, and fourth rows are the same as those of the first control signal sets CSS1-1, CSS1-2, CSS1-3, and CSS1-4, respectively.

During first and second line times 1H and 2H of the line time 1H-TIME2, second control signal sets CSS2-1 and CSS2-2 are generated, respectively. Generation (or starting) timings of second addresses ROW1 and ROW2 for controlling the second pixel group included in the first, second, third, and fourth rows are the same as those of the second control signal sets CSS2-1 and CSS2-2, respectively.

However, as illustrated in FIG. 8, generation timing of the first control signal set CSS1 may be different from that of the second control signal set CSS2.

As illustrated in FIGS. 7 and 8, during the first line time 1H of the line time 1H-TIME1, pixel signals output by the pixels P11 and P13 of the first pixel group included in the first row are read out by the ARCs 170-1 and 170-3 in response to the control signal set CSS1-1 and the first address ADD1=ROW1. During the second line time 2H of the line time 1H-TIME1, pixel signals output by the pixels P21 and P23 of the first pixel group included in the second row are read out by the ARCs 170-1 and 170-3 in response to the first control signal set CSS1-2 and the first address ADD1=ROW2.

During the third line time 3H of the line time 1H-TIME1, pixel signals output by the pixels P31 and P33 of the first pixel group included in the third row are read out by the ARCs 170-1 and 170-3 in response to the first control signal set CSS1-3 and the first address ADD1=ROW3. At this time, during the first line time 1H of the line time 1H-TIME2, pixel signals output by the pixels P12 and P14 of the second pixel group included in the first row are read out by the ARCs 170-2 and 170-4 in response to the second control signal set CSS2-1 and the second address ADD2=ROW1. In other words, the pixel signals output by the pixels P31 and P33 of the first pixel group and the pixel signals output by the pixels P12 and P14 of the second pixel group may be output by the ARCs 170-1 through 170-4 at regular intervals.

During the fourth line time 4H of the line time 1H-TIME2, pixel signals output by the pixels P41 and P43 of the first pixel group included in the fourth row are read out by the ARCs 170-1 and 170-3 in response to the first control signal set CSS1-4 and the first address ADD1=ROW4. At this time, during the second line time 2H of the line time 1H-TIME2, pixel signals output by the pixels P22 and P24 of the second pixel group included in the second row are read out by the ARCs 170-2 and 170-4 in response to the second control signal set CSS2-2 and the second address ADD2=ROW2. In other words, the pixel signals output by the pixels P41 and P43 of the first pixel group and the pixel signals output by the pixels P22 and P24 of the second pixel group may be output by the ARCs 170-1 through 170-4 at regular intervals.

As described above with reference to FIGS. 7 and 8, when the generation timing of the first control signal set CSS1 and that of the second control signal set CSS2 are appropriately adjusted, output timings of the output signals of the ARCs 170-1 through 170-4 may be appropriately adjusted.

FIG. 9 is a conceptual diagram for describing operations of the image sensor 100A or 100B illustrated in FIG. 1 or 7, according to an embodiment of the inventive concept. The pixel array 110 includes a plurality of columns COL1 through COLN (where N is a natural number greater than 2). Each of the columns COL1 through COLN includes multiple pixels.

A first pixel group includes odd-numbered columns COL1, COL3, . . . , COL(N−1), and a second pixel group includes even-numbered columns COL2, COL4, . . . , COLN. Referring to FIGS. 1, 7, and 9, at a K-th frame (where K is a natural number), the first row driver 130 is activated (indicated by shading), and the second row driver 150 is deactivated.

Thus, the activated first row driver 130 controls operations of pixels included in the odd-numbered columns COL1, COL3, . . . , COL(N−1) included in the first pixel group for each row. For example, the odd-numbered columns COL1, COL3, . . . , COL(N−1) are readout and thus may be referred to as readout columns, and the even-numbered columns COL2, COL4, . . . , COLN are skipped and thus may be referred to as skip columns.

At a (K+1)th frame, the first row driver 130 is deactivated, and the second row driver 150 is activated (indicated by shading). Thus, the activated second row driver 150 controls operations of pixels included in the even-numbered columns COL2, COL4, . . . , COLN included in the second pixel group for each row. For example, the odd-numbered columns COL1, COL3, . . . , COL(N−1) are skip columns, and the even-numbered columns COL2, COL4, . . . , COLN are readout columns.

At a (K+2)th frame, the first row driver 130 is activated, and the second row driver 150 is deactivated. Thus, the activated first row driver 150 controls operations of the pixels included in the odd-numbered columns COL1, COL3, . . . , COL(N−1) included in the first pixel group for each row. For example, the odd-numbered columns COL1, COL3, . . . , COL(N−1) are readout columns, and the even-numbered columns COL2, COL4, . . . , COLN are skip columns.

As described above, different pixel groups may be selected by the first row driver 130 and the second row driver 150 corresponding to different frames.

FIG. 10 is a conceptual diagram for describing operations of the image sensor 100A or 100B illustrated in FIG. 1 or 7, according to another embodiment of the inventive concept. Referring to FIGS. 1, 7, and 10, the pixel array 110 includes a plurality of columns COL1 through COLN (where N is a natural number greater than 2). Each of the columns COL1 through COLN includes multiple pixels.

In the depicted embodiment, the first pixel group includes only some of the pixels included in the odd-numbered columns COL1, COL3, . . . , COL(N−1). The second pixel group includes the rest of the pixels included in the odd-numbered columns COL1, COL3, . . . , COLN−1 and the pixels included in the even-numbered columns COL2, COL4, . . . , COLN.

For a preview or a real-time preview, the first row driver 130 is activated under the control of the first control circuit 160, and the second row driver 150 is deactivated under the control of the second control circuit 165 or 166. The activated first row driver 130 controls operations of the some of the pixels included in the odd-numbered columns COL1, COL3, . . . , COL(N−1) from among the pixels included in the first pixel group.

For a still frame or an image capture, the first row driver 130 is deactivated under the control of the first control circuit 160, and the second row driver 150 is activated under the control of the second control circuit 165 or 166. The activated second row driver 150 may control operations of the rest of the pixels included in the odd-numbered columns COL1, COL3, . . . , COL(N−1) and operations of the pixels included in the even-numbered columns COL2, COL4, . . . , COLN.

Notably, the embodiment illustrated in FIG. 10 is only an example. Thus, for a still frame or image capture, when the first row driver 130 is activated under the control of the first control circuit 160, and the second row driver 150 is activated under the control of the second control circuit 165 or 166, the first row driver 130 and the second row driver 150 may control the operations of all of the pixels included in the odd-numbered columns COL1, COL3, . . . , COLN−1 and the operations of all of the pixels included in the even-numbered columns COL2, COL4, . . . , COLN, respectively.

FIG. 11 is a conceptual diagram for describing operations of the image sensor 100A or 100B illustrated in FIG. 1 or 7, according to another embodiment of the inventive concept. Referring to FIGS. 1, 7, and 11, the pixel array 110 includes a plurality of columns COL1 through COLN (where N is a natural number greater than 2). Each of the columns COL1 through COLN includes multiple pixels.

In the depicted embodiment, the first pixel group includes some pixels SF of the pixels included in the odd-numbered columns COL1, COL3, . . . , COL(N−1). The second pixel group includes the remaining pixels P included in the odd-numbered columns COL1, COL3, . . . , COL(N−1) and the pixels P included in the even-numbered columns COL2, COL4, . . . , COLN. For example, the pixels SF may be special purpose pixels, and the pixels P may be color pixels.

The activated first row driver 130 controls operations of the pixels SF included in the first pixel group, and the activated second row driver 150 controls not only operations of the pixels P included in the first pixel group, but also operations of the pixels P included in the second pixel group.

According to another embodiment, the first pixel group may include some pixels SF in the odd-numbered columns COL1, COL3, . . . , COL(N−1), and the second pixel group may include only the remaining pixels P included in the odd-numbered columns COL1, COL3, . . . , COL(N−1). In this case, operations of the pixels P included in the even-numbered columns COL2, COL4, . . . , COLN may be controlled by one of the first row driver 130 and the second row driver 150.

According to how the first control circuit 160 and the second control circuit 165 or 166 respectively control activation timings of the first and second row drivers 130 and 150, the first and second row drivers 130 and 150 may control operation timing of the pixels SF and that of the pixels P, respectively. In other words, the operation timing of the pixels SF and that of the pixels P may be the same as each other or different from each other.

The first row driver 130 may be connected with the pixels SF via respective first signal lines, and the second row driver 150 may be connected with the pixels P via respective second signal lines.

Figure 12:
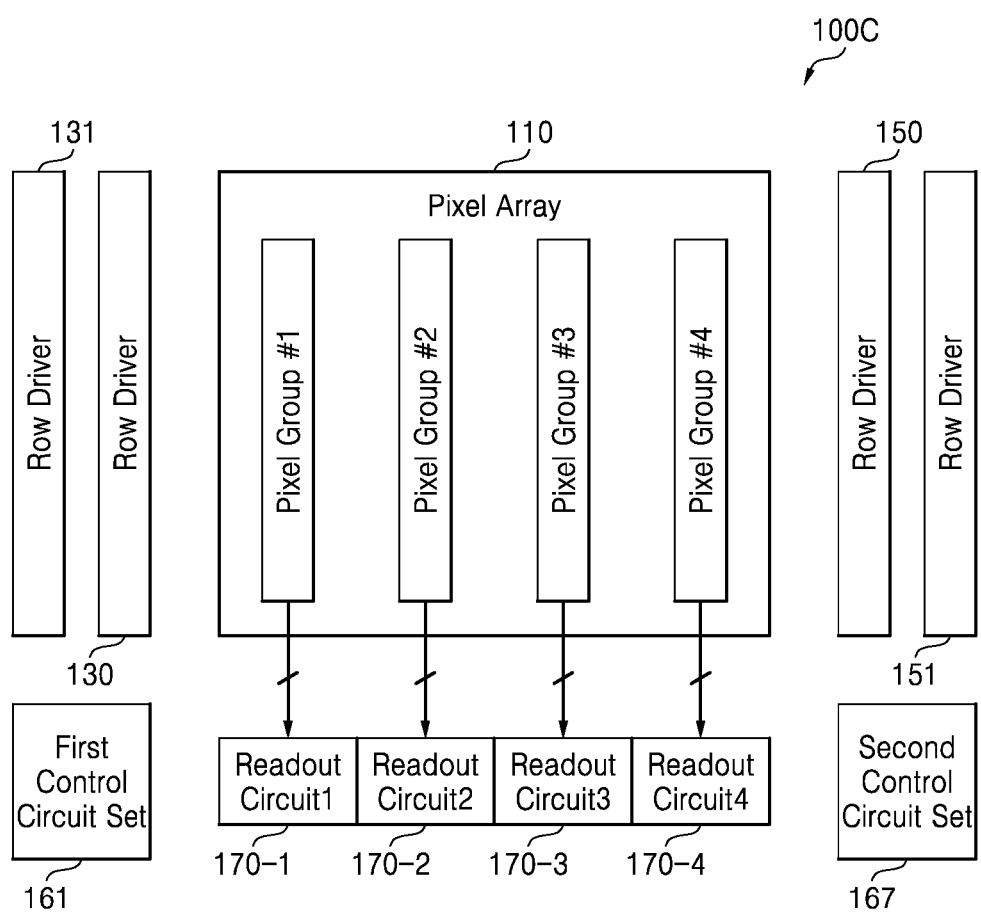
FIG. 12 is a schematic block diagram of an image sensor including multiple row drivers, according to another embodiment of the inventive concept.

FIG. 12 is a block diagram of an image sensor 100C including a plurality of row drivers, according to another embodiment of the inventive concept. The image sensor 100C of FIG. 12, for example, a CMOS image sensor, includes a pixel array 110, a first row driver 130, a second row driver 150, a third row driver 131, a fourth row driver 151, a first control circuit set 161, a second control circuit set 167, and multiple ARCs 170-1 through 170-4.

For convenience of explanation, FIG. 12 illustrates four row drivers, namely, first, second, third, and fourth row drivers 130, 150, 131, and 151, and four pixel groups, namely, first, second, third, and fourth pixel groups. However, in other configurations may include a CMOS image sensor in which pixels are grouped into various numbers of pixel groups according to columns, and the grouped pixel groups are independently controlled using various numbers of row drivers, without departing from the scope of the present teachings.

In the depicted embodiment, pixels included in the pixel array 110 are grouped into four pixel groups. Methods of grouping the pixels into the four pixel groups may vary according to methods of designing the CMOS image sensor. For example, the first pixel group may include pixels included in an i-th column (where i is a natural number), the second pixel group may include pixels included in an (i+1)th column, the third pixel group may include pixels included in an (i+2)th column, and the fourth pixel group may include pixels included in an (i+3)th column. The first row driver 130 may control operations of the first pixel group, the second row driver 150 may control operations of the second pixel group, the third row driver 131 may control operations of the third pixel group, and the fourth row driver 151 may control operations of the fourth pixel group.

The first control circuit set 161 may control operations of the first row driver 130 and the third row driver 131. The second control circuit set 167 may control operations of the second row driver 150 and the fourth row driver 151.

A scheme by which the first control circuit set 161 and second control circuit set 167 control each of the first, third, second, and fourth row drivers 130,150, 131 and 151, respectively, may be substantially the same as or similar to the scheme by which the first control circuit 160 and the second control circuit 165 or 166 control the first and second row drivers 130 and 150, respectively. Each of the ARCs 170-1 through 170-4 may process pixel signals output by each pixel group, and may output the processed pixel signals.

Figure 13:
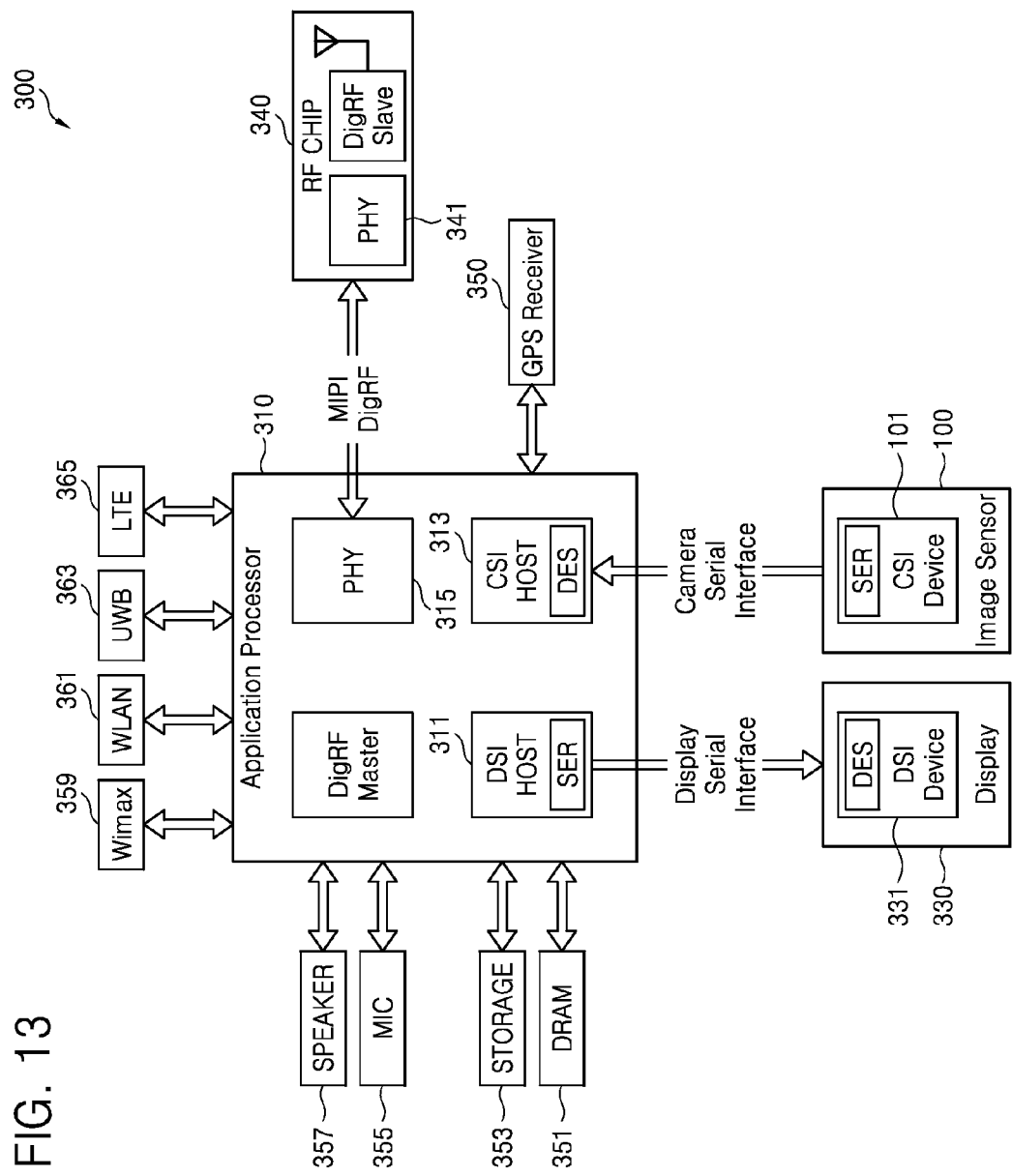
FIG. 13 is a block diagram of an image processing system including the image sensor of FIG. 1, 7, or 12, according to embodiments of the inventive concept.

FIG. 13 is a block diagram of an image processing system 300 including the image sensor 100A of FIG. 1, image sensor 100B of FIG. 7, or image sensor 100C of FIG. 12. Referring to FIGS. 1, 7, 12, and 13, the image processing system 300 may be implemented using a portable electronic device capable of using or supporting a mobile industry processor interface (MIPI).

The portable electronic device may implemented using a laptop computer, a PDA, a portable media player (PMP), a mobile phone, a smart phone, a tablet computer PC, an MID, or a digital camera, for example.

The image processing system 300 includes an application processor (AP) 310, an image sensor 100, and a display 330. The structure and operation of the image sensor 100 are substantially the same as those of the above-described image sensor 100A, 100B, or 100C.

A camera serial interface (CSI) host 313 implemented in the AP 310 may serially communicate with a CSI device 101 of the image sensor 100 via a CSI. According to an embodiment, a deserializer (DES) may be implemented in the CSI host 313, and a serializer (SER) may be implemented in the CSI device 101.

A display serial interface (DSI) host 311 implemented in the AP 310 may serially communicate with a DSI device 331 of the display 330 via a DSI. According to an embodiment, an SER may be implemented in the DSI host 311, and a DES may be implemented in the DSI device 331. Each of the DES and the SER may process an electrical signal or an optical signal.

The image processing system 300 may further include a radio frequency (RF) chip 340 capable of communicating with the AP 310. A physical layer (PHY) 315 of the AP 310 and a PHY 341 of the RF chip 340 may exchange data with each other according to a MIPI DigRF specification. The image processing system 300 may further include a global positioning system (GPS) receiver 350, a memory 351 (e.g., dynamic random access memory (DRAM)), a data storage device 353 implemented using a non-volatile memory (e.g., a NAND flash memory), a microphone 355, and/or a speaker 357.

The image processing system 300 may communicate with an external device using at least one communication protocol (or communication standard), such as worldwide interoperability for microwave access (WiMAX) 359, a wireless local area network (WLAN) 361, an ultra-wideband (UWB) 363, and/or a long term evolution (LTE) 365, for example. Also, the image processing system 300 may communicate with an external wireless communication device using Bluetooth or Wifi.

Figure 14:
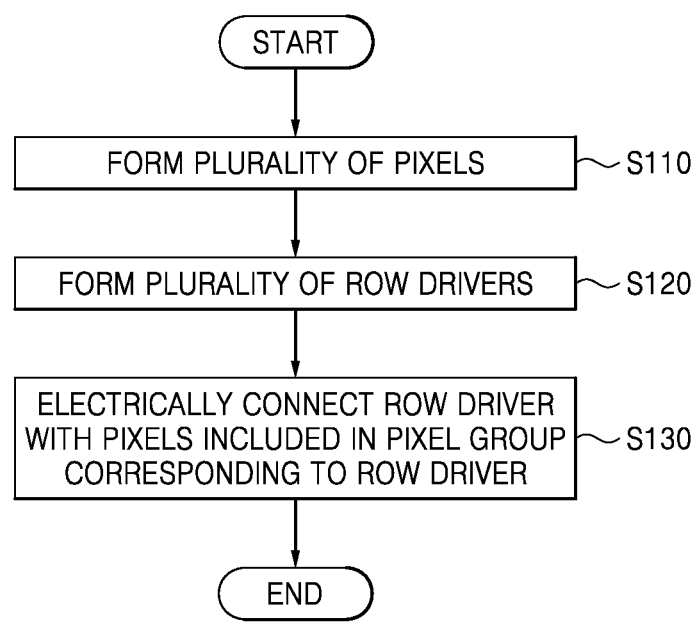
FIG. 14 is a flowchart showing a method of manufacturing an image sensor, according to an embodiment of the inventive concept.

FIG. 14 is a flowchart showing a method of manufacturing the image sensor 100A, 100B, or 100C of FIG. 1, 7, or 12, according to an embodiment of the inventive concept. The image sensor 100A, 100B, or 100C (collectively referred to as the image sensor 100) may be manufactured as a front-side illumination (FSI) image sensor or a backside illumination (BSI) image sensor.

Referring to FIG. 14, in operation S110, A pixels (where A is a natural number) are formed in a row of the pixel array 110 in a semiconductor substrate. The A pixels formed in the row of the pixel array 110 are grouped into B pixel groups (where 1<B<A) in a column direction. The method for the grouping pixels into pixel groups may vary, e.g., according to manufacturers and/or manufacturing techniques, without departing from the scope of the present teachings.

In operation S120, B row driver circuits are formed in the semiconductor substrate. Pixels included in the B pixel groups are connected with the B row driver circuits via corresponding first signal lines, respectively, in operation S130. In other words, a corresponding row driver from among the B row drivers and a corresponding pixel group from among the B pixel groups are electrically connected to each other.

In order to manufacture the image sensor 100A illustrated in FIG. 1, B control circuits are formed on the semiconductor substrate, and one of the B control circuits is connected to the B row driver circuits via second signal lines, in order to supply pixel control signals output by the one B control circuit to the B row driver circuits.

In order to manufacture the image sensor 100B illustrated in FIG. 7, B control circuits are formed on the semiconductor substrate, and the B control circuits are respectively connected to the B row driver circuits via second signal lines, in order to supply respective pixel control signals output by the B control circuits to the B row driver circuits.

Figure 15:
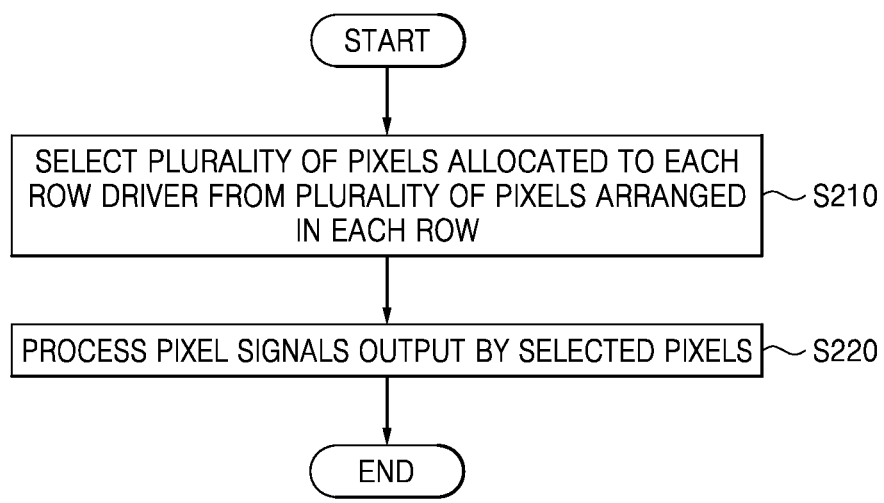
FIG. 15 is a flowchart showing a method of operating an image sensor, according to an embodiment of the inventive concept.

FIG. 15 is a flowchart showing a method of operating the image sensor 100A, 100B, or 100C of FIG. 1, 7, or 12, according to an embodiment of the inventive concept. Referring to FIGS. 1-13 and 15, pixels allocated to each row driver from multiple pixels arranged in each row are selected in operation S210. For example, first readout pixels allocated to a first row driver from among multiple row drivers are selected from multiple pixels arranged in a row of the pixel array 110 by the first row driver. Also, multiple second readout pixels allocated to a second row driver from among the multiple row drivers are selected from the multiple pixels by the second row driver.

In operation S220, pixel signals output by the selected pixels are processed. For example, a first readout circuit from among multiple readout circuits processes first pixel signals output by the first readout pixels. Also, a second readout circuit from among the multiple readout circuits processes second pixel signals output by the second readout pixels. The processing of the first pixel signals and the processing of the second pixel signals may be performed simultaneously or at different timings.

In an image sensor including row drivers according to embodiments of the inventive concept, pixels included in a pixel array may be grouped into a plurality of pixel groups in a column direction. Respective pixels included in the pixel groups may be independently controlled using row drivers respectively allocated to the pixel groups.

Since the image sensor may control a pixel group included in the same row using a row driver allocated to the pixel group within the same frame, the image sensor may perform various patterns of data binning. The image sensor may control different exposure times for different pixels on the same pixel array. The image sensor may selectively read out output signals of different types of pixels included in a pixel array.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An image sensor comprising:
a plurality of pixel groups arranged in a plurality of rows included in a pixel array, the pixel array comprising a plurality of pixels respectively allocated to the plurality of pixel groups;
a plurality of row drivers configured to respectively control operations of the plurality of pixels respectively allocated to the plurality of pixel groups in the row, wherein each pixel group of the plurality of pixel groups connects to one corresponding row driver of the plurality of row drivers; and
a plurality of readout circuits configured to respectively read out pixel signals output by the plurality of pixels respectively allocated to the plurality of pixel groups in each of the plurality of rows,
wherein the plurality of row drivers are further configured to respectively generate corresponding row control signals to control operations for controlling pixels included in each row among the plurality of rows, and wherein the plurality of row drivers are activated at different frames to control operations of corresponding pixels.

2. The image sensor of claim 1, further comprising:
a plurality of control circuits configured to respectively control operations of the plurality of row drivers, wherein the plurality of row drivers share pixel control signals output by one of the plurality of control circuits.

3. The image sensor of claim 2, wherein respective operations of the plurality of readout circuits are controlled in response to readout control signals output by the one of the plurality of control circuits.

4. The image sensor of claim 1, further comprising:
a plurality of control circuits configured to respectively generate corresponding pixel control signals in order to independently control operations of the plurality of row drivers, respectively.

5. The image sensor of claim 1, further comprising:
a plurality of control circuits configured to respectively control operations of the plurality of row drivers, wherein a timing of pixel control signals output by a first control circuit of the plurality of control circuits is the same as a timing of pixel control signals output by a second control circuit of the plurality of control circuits.

6. The image sensor of claim 1, further comprising:
a plurality of control circuits configured to respectively control operations of the plurality of row drivers, wherein a timing of pixel control signals output by a first control circuit of the plurality of control circuits is different from a timing of pixel control signals output by a second control circuit of the plurality of control circuits.

7. The image sensor of claim 1, wherein a first row driver of the plurality of row drivers is activated for a real-time preview, and a second row driver of the plurality of row drivers is activated for an image capture, the second row driver different from the first row driver.

8. The image sensor of claim 1, wherein the plurality of pixels included in the pixel array are color pixels.

9. An image processing system, comprising:
an image sensor; and
a processor configured to control operations of the image sensor,
wherein the image sensor comprises:
a first pixel group arranged in at least a first column and a plurality of rows included in a pixel array, the first pixel group comprising first pixels;
a second pixel group arranged at least a second column and the plurality of rows included in the pixel array, the second pixel group comprising second pixels;
a first row driver connected to the first pixels in the first pixel group and to no second pixels in the second pixel group, the first row driver being configured to generate a plurality of first row control signals to control operations of the first pixels in the first pixel group, each of the plurality of first row control signals being for controlling at least one pixel included in the first pixel group and arranged in a corresponding row among the plurality of rows;
a second row driver connected to the second pixels in the second pixel group and to no first pixels in the first pixel group, the second row driver being configured to generate a plurality of second row control signals to control operations of the second pixels in the second pixel group, each of the plurality of second row control signals being for controlling at least one pixel included in the second pixel group and arranged in a corresponding row among the plurality of rows;
a first readout circuit corresponding to the first column, configured to read out first output signals of the first pixels; and
a second readout circuit corresponding to the second column, configured to read out second output signals of the second pixels,
wherein the first row driver and the second row driver are activated at different frames to control corresponding pixels.

10. The image processing system of claim 9, wherein the first pixels and the second pixels are color pixels.

11. The image processing system of claim 9, further comprising:
a first control circuit configured to generate a first address and pixel control signals; and
a second control circuit configured to generate a second address,
wherein the first row driver controls operations of the first pixels based on the first address and the pixel control signals, and the second row driver controls operations of the second pixels based on the second address and the pixel control signals.

12. The image processing system of claim 11, wherein a timing of the first address is the same as a timing of the second address.

13. The image processing system of claim 9, further comprising:
a first control circuit configured to generate a first address and first pixel control signals; and
a second control circuit configured to generate a second address and second pixel control signals,
wherein the first row driver controls operations of the first pixels based on the first address and the first pixel control signals, and the second row driver controls operations of the second pixels based on the second address and the second pixel control signals.

14. The image processing system of claim 13, wherein the first readout circuit and the second readout circuit are controlled by the first control circuit and the second control circuit, respectively.

15. The image processing system of claim 14, wherein a timing of the first pixel control signals is different from a timing of the second pixel control signals.

16. The image processing system of claim 14, wherein a timing of the first address is different from that of the second address.

17. The image processing system of claim 9, wherein the first row driver is activated for a real-time preview, and the second row driver is activated for an image capture.

* * * * *